(12) United States Patent
Motojima et al.

(10) Patent No.: US 8,203,349 B2
(45) Date of Patent: Jun. 19, 2012

(54) PROXIMITY AND CONTACT SENSOR AND SENSOR ELEMENT

(75) Inventors: Seiji Motojima, Gifu (JP); Shaoming Yang, Gifu (JP); Makoto Takaki, Kyoto (JP); Kenji Kawabe, Kakamigahara (JP)

(73) Assignees: Shimadzu Corporation, Kyoto (JP); CMC Technology Development Co., Ltd., Gifu (JP)

( * ) Notice: Subject to any disclaimer, the term of this patent is extended or adjusted under 35 U.S.C. 154(b) by 1000 days.

(21) Appl. No.: 12/161,828

(22) PCT Filed: Jan. 23, 2007

(86) PCT No.: PCT/JP2007/050952
§ 371 (c)(1),
(2), (4) Date: Jul. 23, 2008

(87) PCT Pub. No.: WO2007/086358
PCT Pub. Date: Aug. 2, 2007

(65) Prior Publication Data
US 2010/0219840 A1 Sep. 2, 2010

(30) Foreign Application Priority Data

Jan. 24, 2006 (JP) .................................. 2006-015555
Sep. 25, 2006 (JP) .................................. 2006-259718

(51) Int. Cl.
*G01R 27/28* (2006.01)
*G01R 27/26* (2006.01)
(52) U.S. Cl. .......................... 324/655; 324/652; 324/658
(58) Field of Classification Search .................. 324/652, 324/655, 658
See application file for complete search history.

(56) References Cited

U.S. PATENT DOCUMENTS

2007/0257821 A1* 11/2007 Son et al. ...................... 341/22

FOREIGN PATENT DOCUMENTS

| JP | 2001-203565 A | 7/2001 |
|---|---|---|
| JP | 2004-150869 A | 5/2004 |
| JP | 2005-049331 | 2/2005 |
| JP | 2005-049331 A | 2/2005 |
| JP | 2005-049332 | 2/2005 |
| JP | 2005-291927 | 10/2005 |
| JP | 2005-291927 A | 10/2005 |
| JP | 2006-275622 | 10/2006 |

OTHER PUBLICATIONS

International Search Report issued in priority Application No. PCT/JP2007/050952.
International Preliminary Report on Patentability, dated Jul. 29, 2008, and Written Opinion, issued in corresponding International Application No. PCT/JP2007/050952.

* cited by examiner

*Primary Examiner* — Amy He
(74) *Attorney, Agent, or Firm* — Saul Ewing LLP

(57) ABSTRACT

A proximity and contact sensor (10) is provided with a sensor element (11) and a detection circuit (16). The sensor element is provided with a matrix (13) in which coil-shaped carbon fibers (12) are dispersed. A high-frequency oscillation circuit (19) of the detection circuit (16) supplies the sensor element with a high-frequency signal. A detector (22) in the detection circuit (16) receives an output signal from the sensor element (11) and detects proximity of an object (24). In one example, the coil-shaped carbon fibers (12) are contained in the matrix by 1 to 20% by weight. In another example, a high-frequency oscillation circuit generates a high-frequency signal of 100 to 800 kHz.

18 Claims, 11 Drawing Sheets

PROXIMITY AND CONTACT SENSOR AND SENSOR ELEMENT

CROSS REFERENCE TO RELATED APPLICATIONS

This application claims the priority of PCT/JP2007/050952, filed on Jan. 23, 2007, which claims priority to Japanese Application No. 2006-015555, filed Jan. 24, 2006 and Japanese Application No. 2006-259718, filed Sep. 25, 2006, the entire contents of which are hereby incorporated in total by reference.

TECHNICAL FIELD

The present invention relates to a sensor for detecting the approach and contact of an object, such as a human body.

BACKGROUND ART

A proximity and contact sensor has been developed for equipment such as medical equipment used for diagnosis or treatment purposes. A proximity and contact sensor detects whether a human body approaches to the equipment in a non-contacting method. A conventional proximity and contact sensor includes a detection plate formed by two electrodes and detects the approaching of a human body through changes in the capacitance of the detection plate (refer to patent document 1). The conventional proximity sensor consists of an oscillation circuit, which generates a measurement signal having a predetermined frequency, a VSWR bridge circuit, which is connected to the oscillation circuit, a phase comparison circuit, which detects the phase difference between an output signal of the bridge circuit and the measurement signal of the oscillation circuit, and a control method, which determines whether or not a human body is approaching based on the output of the phase comparison circuit.

Another conventional proximity sensor consists of a sensing part of a capacitance type proximity and contact sensor and a conductor, in which a thickness and a surface resistance of the conductor are set in a predetermined range (refer to patent document 2). In this proximity and contact sensor, the ratio between the conductor area and the sensing part area of the capacitance type proximity and contact sensor is adjusted to be two times or higher value so as to achieve both of limiting the enlargement of the sensing area and widening the detection range.

[Patent Document 1] Japanese Laid-Open Patent Publication No. 2001-203565

[Patent Document 2] Japanese Laid-Open Patent Publication No. 2004-150869

DISCLOSURE OF THE INVENTION

In the conventional proximity sensors described in patent documents 1 and 2, the detection plate or the sensing part of the capacitance type proximity sensor detects changes in the capacitance between an object to be detected and the detection plate or the sensing part when the object to be detected approaches. These conventional methods detecting the approaching of the object only by changes in the capacitance has a disadvantage such that when the approaching speed of the object is slow, the detection sensitivity decreases because of the very small change in the capacitance, then the sensitivity becomes low. Small changes in the capacitance are difficult to detect due to noise and thus cannot be detected with stable accuracy. Furthermore, the conventional proximity sensors cannot quantitatively detect the approaching speed nor distinguishably detect the characteristics of the object material to be detected.

The present invention provides a sensor that detects the approach and contact of an object to be detected with high sensitivity, high stability, quantitatively in the approaching speed of the object, and distinguishably in the characteristics of the object material.

To achieve the above purpose, one form of the present invention is a sensor for detecting the approach and contact of an object to be detected. The sensor consists of a sensor element, a pair of electrodes, a high frequency oscillation circuit and a wave detection circuit. A sensor element consists of a matrix and coil-shaped carbon fibers dispersed in the matrix. The coil-shaped carbon fibers have an inductance (L) component, a capacitance (C) component, and a resistance (R) component that are depending on the configuration of the coil-shaped carbon fibers, and the coil-shaped fibers function as an LCR resonance circuit. A pair of electrodes is electrically connected to the sensor element. A high-frequency oscillation circuit is connected between the pair of electrodes. A wave detection circuit detects a signal change that is caused in the LCR resonance circuit.

Other form of the present invention is a construction of the sensor, which consists of a sensor element, a set of electrodes, a high frequency oscillation circuit and a wave detection circuit. The sensor element consists of an elastically deformable matrix and elastically deformable coil-shaped carbon fibers dispersed in the matrix. The sensor element has impedance that changes depending on the elastic deformation of the matrix and the coil-shaped carbon fibers. A set of electrodes consists of first and second electrodes and those electrodes are electrically connected to the sensor element. A high-frequency oscillation circuit provides a high-frequency excitation signal to the sensor element via the first electrodes. A wave detection circuit receives an output signal of the sensor element via the second electrodes and generates a detection signal that corresponds to a change in the impedance of the sensor element that is caused when the object approaches to the sensor element.

Other form of the present invention is a configuration of the sensor element. The sensor element has a void portion inside the matrix or a part of the matrix. The void portion enables the sensor element to be deformed easily.

BEST MODE FOR CARRYING OUT THE INVENTION

A proximity and contact sensor according to a preferred embodiment of the present invention is described below.

Figure 1:
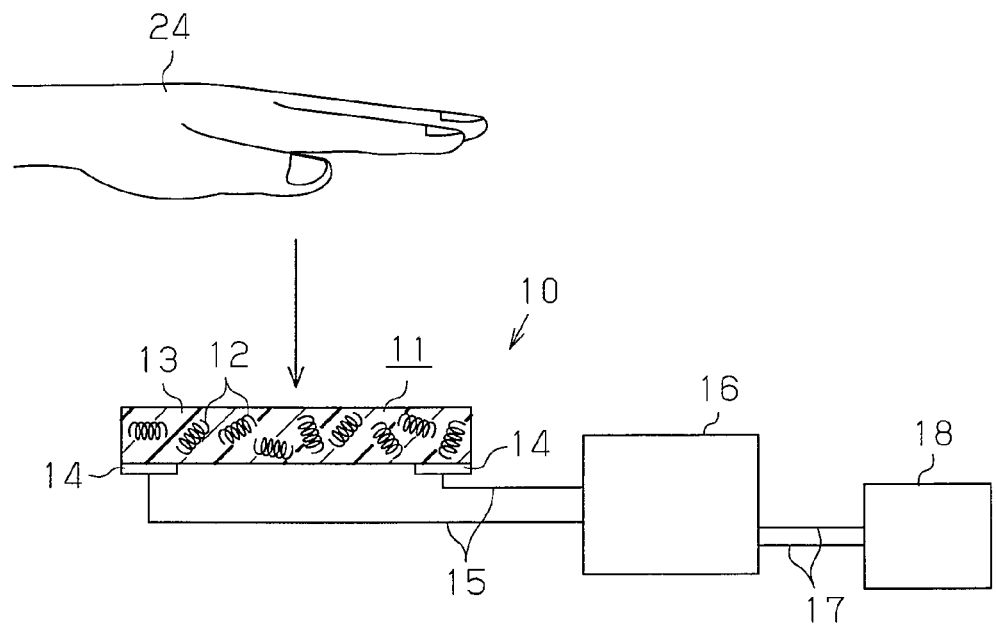
FIG. 1 is a schematic diagram of a proximity sensor according to a first embodiment of the present invention.

As shown in FIG. 1, a sensor element 11, which forms a proximity and contact sensor 10 according to a first embodiment, includes a board-shaped matrix 13 and coil-shaped carbon fibers 12 dispersed in the matrix 13. Two electrodes 14 are electrically connected to the bottom surface of the sensor element 11. The two electrodes 14 are plates preferably made of a conductor such as copper. A detection circuit 16 is connected between the electrodes 14 by first connection lines 15. The detection circuit 16 is connected to a processor 18 by second connection lines 17. The processor 18 is an oscilloscope for displaying the waveform of an output signal of the detection circuit 16 or a computer for processing the output signal of the detection circuit 16. The phrase "electrically connect" refers to a connection in which current induced from the electrodes 14 into the matrix 13 flows from the electrode 14 to the coil-shaped carbon fibers 12 or between the coil-shaped carbon fibers 12 through the matrix 13.

Figure 2:
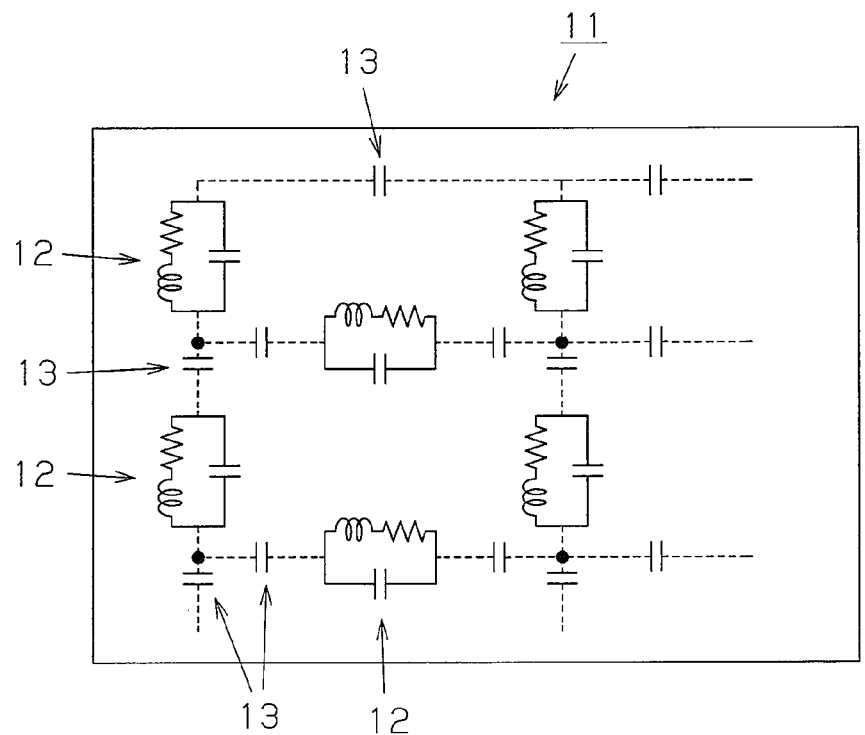
FIG. 2 is an equivalent circuit diagram of a sensor element shown in FIG. 1.

An equivalent circuit of the sensor element 11 is shown in FIG. 2. As shown in FIG. 2, the coil-shaped carbon fibers 12 have electromagnetic characteristics corresponding to their coil shape (spiral shape). The electromagnetic characteristics of the coil-shaped carbon fiber 12 is an inherent inductance (L) component, a capacitance (C) component, and a resistance (R) component and thus referred to as a LCR component. The dispersed coil-shaped carbon fibers 12 in the matrix 13 are electrically connected through the matrix 13, which has the capacitance (C) component. Thus, not only each coil-shaped carbon fiber 12 independently forming an LCR resonance circuit, but also the dispersed coil-shaped carbon fibers 12 and the matrix 13 cooperate to form a resonance circuit network.

Figure 3:
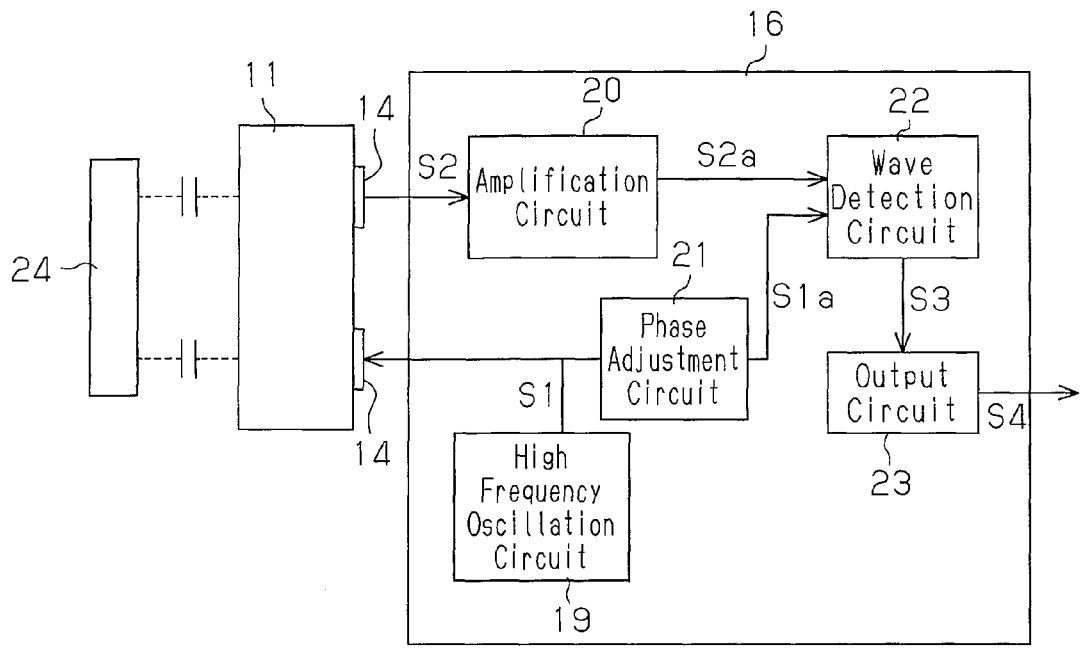
FIG. 3 is a block circuit diagram of the proximity and contact sensor shown in FIG. 1.

The electric circuit of the proximity and contact sensor 10 is described in detail with reference to FIG. 3. As shown in FIG. 3, the detection circuit 16 consists of a high-frequency oscillation circuit (AC circuit) 19, an amplification circuit 20, a phase adjustment circuit 21, an wave detection circuit 22 and an output circuit 23. The high-frequency oscillation circuit 19 is connected to a node between the sensor element 11 and a phase adjustment circuit 21, and provides a high-frequency signal S1 to the sensor element 11 and to the phase adjustment circuit 21. The amplification circuit 20 is connected between the sensor element 11 and the wave detection circuit 22, and amplifies the output signal S2 of the sensor element 11, and generates and provides an amplified output signal S2a to the wave detection circuit 22. The phase adjustment Circuit 21 adjusts the phase of the high-frequency signal S1 of the high-frequency oscillation circuit 19 and provides a phase-adjusted high-frequency signal (or reference high-frequency signal) S1a to the wave detection circuit 22. The wave detection circuit 22 compares the amplified output signal S2a and the phase-adjusted high-frequency signal S1a to generate a detection signal S3 corresponding to the comparison result. The output circuit 23 generates and outputs an output signal S4 having voltage corresponding to the detection signal S3.

The sensor element 11 has intrinsic impedance. An object to be detected 24 also has intrinsic impedance. A high-frequency signal having a predetermined frequency is applied to the sensor element 11 by the high-frequency oscillation circuit 19. Thus, an AC electric field is generated near the sensor element 11. In addition to the capacitance (C) component of the sensor element 11, a capacitance (C) component between the sensor element 11 and the object to be detected 24 is also generated. Thus, the sum of the two capacitances (C) components changes as the object to be detected 24 approaches the sensor element 11. The impedance of the sensor element 11 changes as the sum of the capacitance (C) components changes. When the object to be detected 24 comes into contact with the sensor element 11, the sum of the resistance (R) components of the sensor element 11 and object to be detected 24 changes. The change in the sum of the resistance (R) components changes the impedance of the sensor element 11.

The voltage and the phase of the high-frequency signal S1 applied to the sensor element 11 change depending on the amount of change in impedance. Then, the changed high-frequency signal S2 is output from the sensor element 11. The changed high-frequency signal S2 is amplified by the amplification circuit 20, and the amount of change in the voltage and the phase of the high-frequency signal S2 is amplified. The wave detection circuit 22 detects or compares the changed and amplified high-frequency signal S2a and the high-frequency signal (or reference high-frequency signal) S1a provided from the high-frequency oscillation circuit 19 through the phase adjustment circuit 21 to detect or monitor continuous changes in the impedance caused by the approach of the object to be detected 24. The wave detection circuit 22 generates the detection signal S3 in correspondence with the wave detection result of the high-frequency signals S2a and S1a, and provides the output circuit 23 with the detection signal S3. The output circuit 23 outputs the output signal S4 in correspondence with the detection signal S3, for example, outputs a voltage signal corresponding to the detection signal.

Figure 4:
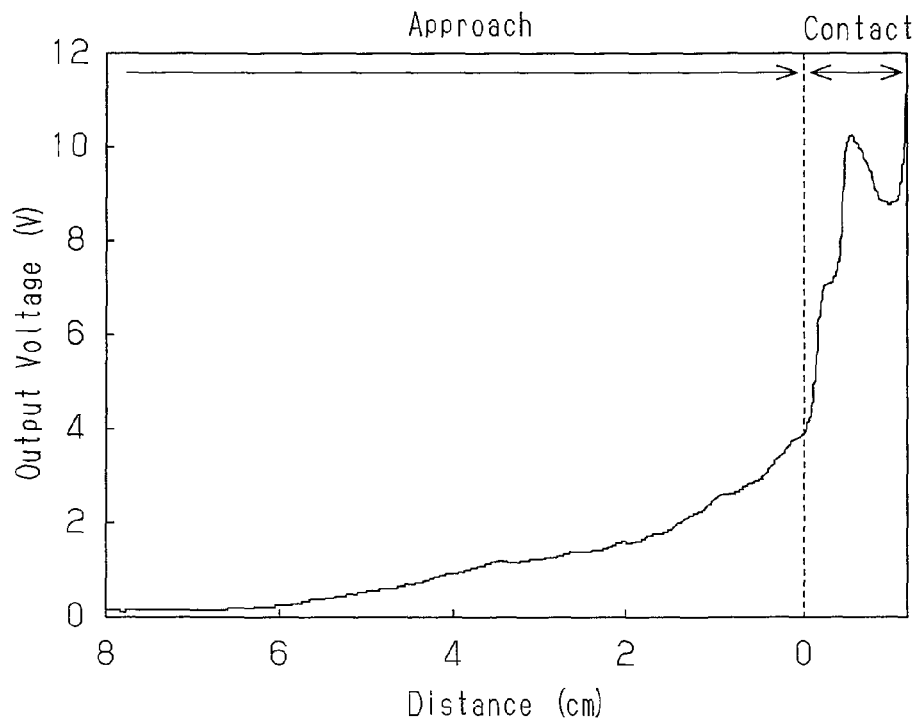
FIG. 4 is a graph showing the relationship between the distance from a hand to the sensor element and the output voltage of the proximity and contact sensor.

In FIG. 4, the vertical axis and horizontal axis indicate the voltage of the output signal S4 and the distance between the object to be detected 24 and the sensor element 11 respectively. The palm of a person's hand is used as the object to be detected 24. As the palm approaches the sensor element 11 and the distance (cm) between the palm and the sensor element 11 shortens, the output voltage (V) increases in a substantially proportional manner. The output signal curve, that is, the relationship between the output signal and the distance show changes that are unique to the object to be detected 24.

Accordingly, unique changes, or the waveform, of the output signal S4 can be measured in advance for a certain object to be detected 24 and a database is build, so that the processor 18 can refer the output signal S4 to the database, and quantitatively determine the approaching speed, distance and other characteristics of the object to be detected 24 relative to the sensor element 11. Furthermore, inherent changes, or the waveform, of the output signal S4 can be measured in advance for various object to be detected 24 and a database is build, so that the processor 18 can refer the output signal S4 to the database, and determine the substance of object to be detected 24. For example, distinction between an animate object and an inanimate object, distinction between a metal and a ceramic, distinction between a metal and a resin can be made. The database may be formed in a storage device of the processor 18, or in an external storage device accessible by the processor 18.

The impedance of the sensor element 11 changes when the object to be detected 24 contacts the sensor element 11 of the proximity and contact sensor 10. The wave detection circuit 22 detects the amount of change in the impedance so that the proximity and contact sensor 10 can also detect the contact of an object in addition to the approaching of the object.

The matrix 13 works as a dispersive media for the coil-shaped carbon fibers 12. The matrix 13 is preferably formed from an elastically deformable material such as an elastic resin (polymer having elasticity) and a non-elastically deformable material such as hard resin that have a capacitance (C) component as an electromagnetic characteristic. In the first embodiment, a shaped product of silicone resin, urethane resin, epoxy resin, copolymer resin of styrene and thermoplastic elastomer, or the like is used as the matrix 13. Examples of silicone resin include products named KE103 (JIS A hardness 18), KE106 (JIS A hardness 50), and KE1202 (JIS A hardness 65) manufactured by Shin-Etsu Chemical Co., Ltd. Examples of copolymer resin of styrene and thermoplastic elastomer include products named Septon Resin #4033 (JIS A hardness 76) and #8104 (JIS A hardness 98) manufactured by Kuraray Co., Ltd. Examples of urethane resin include products names Coronate 4387 of Nippon Polyurethane Industry Co.

The hardness of the matrix 13 is related to the sensitivity of the proximity and contact sensor 10. If the matrix 13 is a shaped product having excellent elasticity made of silicone resin etc., the capacitance of the matrix 13 can be increased and the sensitivity of the sensor element 11 can be enhanced. If the matrix 13 is a shaped product made of hard silicone resin, urethane resin, Septon resin, or the like, the capacitance of the matrix 13 slightly decreases. In this case, the sensitivity of the sensor element 11 decreases but the detection range is extended. Thus, the matrix 13 has a capacitance (C) component and functions as a capacitor, it increases the total capacitance in addition to the C component of the coil-shaped carbon fibers 12. This expands the adjustment width of the capacitance in the LCR resonance circuit.

As the coil-shaped carbon fibers 12 have a helical shape, when the high-frequency signal flowing through the coil-shaped carbon fiber 12 changes the impedance of the sensor element 11 changes, which includes aforementioned resonance circuit of the L component, C component, and R component, and the resonance circuit network of the dispersed coil-shaped carbon fibers 12 and matrix 13. Thus, the approaching of the object to be detected 24 can be detected with the wave detection circuit 22 based on the amount of change in impedance. The inductance (L) component refers to the induction coefficient, that is, the self-induction coefficient or the mutual induction coefficient, and is one of the electromagnetic induction characteristics. The capacitance (C) component refers to the capacitance that represents in the ratio of charge to the potential (voltage) and is one of the electromagnetic induction characteristics. The resistance (R) component refers to the electrical resistance and is one of the electromagnetic induction characteristics.

An example of a preferred coil-shaped carbon fiber 12 is a single-helix coil-shaped carbon fiber 12, double-helix coil-shaped carbon fiber 12, a super-elastic coil, and a mixture of such coils. The single-helix coil-shaped carbon fiber 12 is a coil in which a fiber having a constant wire diameter extends spirally in single windings at a constant pitch. The preferable single-helix coil-shaped carbon fiber 12 has a wire diameter of 0.1 µm to 1 µm, a coil diameter of 0.01 µm to 50 µm, a coil pitch of 0.01 µm to 10 µm, and a coil length of 0.1 mm to 10 mm. From the viewpoint of easy manufacturing, the preferable diameter of the coil is 0.1 µm to 10 µm, and the pitch is between 0.1 µm to 10 µm.

The double-helix coil-shaped carbon fiber 12 is a hollow and cylindrical coil in which two coils are winding alternate with each other and in contact with each other without any gaps. The preferable double-helix coil-shaped carbon fiber 12 has a wire diameter of 0.1 µm to 1 µm, a coil diameter of 0.01 µm to 50 µm, a pitch that is substantially the same as the wire diameter (the gap between fibers being substantially zero), and a length of 0.1 mm to 10 mm.

The super-elastic coil refers to a coil having greater elasticity with a relatively large coil diameter and a small wire diameter. The preferable super-elastic coil has a coil diameter of 5 µm to 50 µm, a coil pitch of 0.1 µm to 10 µm, and a coil length of 0.3 mm to 5 mm.

The winding direction of the coil-shaped carbon fiber 12 may be either a clockwise direction (right handed) or a counterclockwise direction (left handed) about the center axis of the coil.

The coil-shaped carbon fiber 12 may be randomly oriented in the matrix 13 or oriented in a same direction aligned by using such as an electric field or magnetic field. If the coil-shaped carbon fibers 12 are oriented in a same direction, the function of the LCR circuit can be achieved higher level in the oriented direction, and the sensor element 11 can obtain directivity.

Although the coil-shaped carbon fiber 12 may be formed by an amorphous carbon fiber, the preferred coil-shaped carbon fiber 12 is a carbon fiber having a crystallized graphite layer that are obtained by processing heat treatment on the amorphous carbon fiber. In this case, the coil-shaped carbon fiber 12 has carbon particles, which form the carbon fiber, aligned with uniformity in the graphite layer. This causes the electrical resistance change, that occurs when exposed to a variable electromagnetic field, to become remarkable, which in turn, causes the resonance characteristic to become remarkable. Therefore, the detection accuracy of the sensor element is improved, and the sensitivity increases.

The quantity of the coil-shaped carbon fibers 12 dispersed in the matrix 13 is preferably at 1 to 20% by weight. If the content of the coil-shaped carbon fibers 12 is lower than 1% by weight, the sensitivity of the proximity and contact sensor 10 based on the coil-shaped carbon fiber 12 tends to decrease. If the content of the coil-shaped carbon fiber 12 exceeds 20% by weight, the sensor element 11 may become hard, the sensitivity of the sensor element 11 may decrease, and the moldability of the sensor element 11 tends to become poor.

The followings are examples of methods for dispersing the coil-shaped carbon fiber 12 in the matrix 13.

(1) One method includes adding the coil-shaped carbon fibers 12 to the initial material (preferably liquid state) of the matrix 13, agitating and dispersing the coil-shaped carbon fibers 12 uniformly, defoaming, casting into a mold, pressurizing, cooling, and solidifying. This method is optimal when using silicone resin and the like for the initial material of the matrix 13.

(2) Another method includes adding a plasticizer to pellets of the matrix 13, heating and melting the pellets, adding the coil-shaped carbon fibers 12, agitating and dispersing the coil-shaped carbon fibers 12 uniformly, casting into the mold, pressurizing, cooling, and solidifying.

(3) A further method includes heating and melting the matrix 13, adding the coil-shaped carbon fiber 12, agitating and dispersing the coil-shaped carbon fiber 12 uniformly, casting into the mold, pressurizing, cooling, and solidifying.

The high-frequency oscillation circuit 19 preferably outputs a high-frequency signal having a frequency in the range of 50 kHz to 1 MHz. The frequency of the high-frequency signal is preferably between 100 and 800 kHz from the viewpoint of sensitivity and stability of the sensor element 11. If the frequency of the high-frequency signal is lower than 50 kHz, the generation of noise may increase, and the detection tends to become unstable. If the frequency of the high-frequency signal exceeds 1 MHz, the output signal may become weak, and the sensitivity tends to decrease.

Instead of a living body such as a hand, the object to be detected 24 of the proximity and contact sensor 10 may be metal, ceramics or resin. Since the surface of a living body is electrically charged, the function of the LCR resonance circuit of the coil-shaped carbon fiber 12 is enhanced when the living body approaches the sensor element 11, and the detection sensitivity of the proximity and contact sensor 10 increases. Examples of a living body (or part of a living body) are hand, arm, face, and leg.

The operation of the proximity and contact sensor 10 in the first embodiment is described below.

A high-frequency signal is applied to the sensor element 11 by the high-frequency oscillation circuit 19. The object to be detected 24 approaches the sensor element 11 in this state. Each coil-shaped carbon fiber 12 in the sensor element 11 has an intrinsic L component, C component, and R component and forms the LCR resonance circuit. Also, the dispersed coil-shaped carbon fibers 12 make up a resonance circuit network in the matrix 13. When the distance between the objects to be detected 24 and the sensor 11, both of which have different intrinsic impedances, becomes short, the impedance of the sensor element 11 changes due to the LCR resonance circuit and the resonance circuit network in the sensor element 11.

A change in the impedance of the sensor element 11 causes change in the high-frequency signal S1 (voltage, phase etc.). The amount of change is amplified by the amplification circuit 20. The amplified signal S2a is provided to the wave detection circuit 22. The high-frequency oscillation circuit 19 provides the high-frequency signal S1 to the phase adjustment circuit 21, as well as to the sensor element 11. The phase adjustment circuit 21 provides the phase-adjusted high-frequency signal to the wave detection circuit 22. The wave detection circuit 22 compares the amplified signal S2a with the phase-adjusted high-frequency signal S1a as a reference, and generates the detection signal S3, and provide to the output circuit 23. The output signal S4 from the output circuit 23 is displayed as an appropriate waveform on the screen of an oscilloscope, which serves as the processor 18, for visual recognition.

Inherent changes of the output signal for a specific object to be detected 24, that is shown as an output waveform (shape of curve), is measured in advance to build a database, so that the approaching speed and distance can be determined from the output waveform when the approaching speed or distance of the object to be detected 24 relative to the sensor element 11 changes. The inherent output waveform can be measured in advance to build a database for various object to be detected 24 such as an animate object (palm) or an inanimate object (steel plate) so that the approaching speed, distance, and substance of the object to be detected 24 can be determined based on the detected waveform and database.

The first embodiment has the advantages described below.

In the proximity and contact sensor 10 of the first embodiment, the coil-shaped carbon fibers 12 are dispersed in the matrix 13 to form the sensor element 11. The coil-shaped carbon fiber 12 functions as an LCR resonance circuit having L component, C component and R component based on the shape of the coil, and the coil-shaped carbon fibers 12 and the matrix 13 makes a resonance circuit network. The two electrodes 14 are electrically connected to the sensor element 11, and the high-frequency oscillation circuit 19 and the wave detection circuit 22 are connected between the electrodes 14.

Thus, when the object to be detected 24 approaches to the sensor element 11 to which the high-frequency signal is applied, the LCR resonance circuit and the resonance circuit network affects to change the impedance of the sensor element 11. This impedance change causes changes in the high-frequency signal, and the high-frequency signal change is detected by the wave detection circuit 22. Therefore, the detection sensitivity for the approaching of the object to be detected 24 is higher and more stable than the conventional proximity sensor in which detections are carried out based on only the capacitance component.

Based on continuous impedance changes caused by the approaching of the object to be detected 24 to the sensor element 11, quantitative detections of the approaching speed or the like and recognition of the material of object to be detected 24 can be carried out. Thus, the proximity and contact sensor 10 is optimal for use in the field of medical equipment for diagnosis or treatment, or the other fields like robots.

The performance of the proximity and contact sensor 10 is sufficiently pulled out when the quantity of the coil-shaped carbon fibers 12 in the matrix 13 is in the range of 1 to 20% in weight percent.

The effect of the proximity and contact sensor 10 is effectively pulled out when the frequency of the high-frequency signal generated by the high-frequency oscillation circuit 19 is in the range of 100 to 800 kHz.

When the object to be detected 24 contacts the sensor element 11, the proximity and contact sensor 10 shows an output signal which is different from that when the object to be detected 24 is approaching. Accordingly, the proximity and contact sensor 10 acts as an approach and contact sensor that detects not only the approaching of the object to be detected 24 but also the contact of the object to be detected 24. By using elastically deformable material such as elastic polymer including silicone resin having elasticity for the matrix 13, the proximity and contact sensor 10 detects the amount of the pressure applied to the proximity and contact sensor 10 by the object to be detected 24, in addition to the approach and contact of the object to be detected 24. The use of elastic polymer prevents or reduces damage which may be caused by the collision between the object to be detected 24 and the proximity and contact sensor 10.

If the object to be detected 24 is a living body, the detection sensitivity can be increased by the electric charges coming out to the surface of the living body, and the approaching of a living body is accurately detected.

Examples are described hereafter in detail.

Example 1

Figure 5:
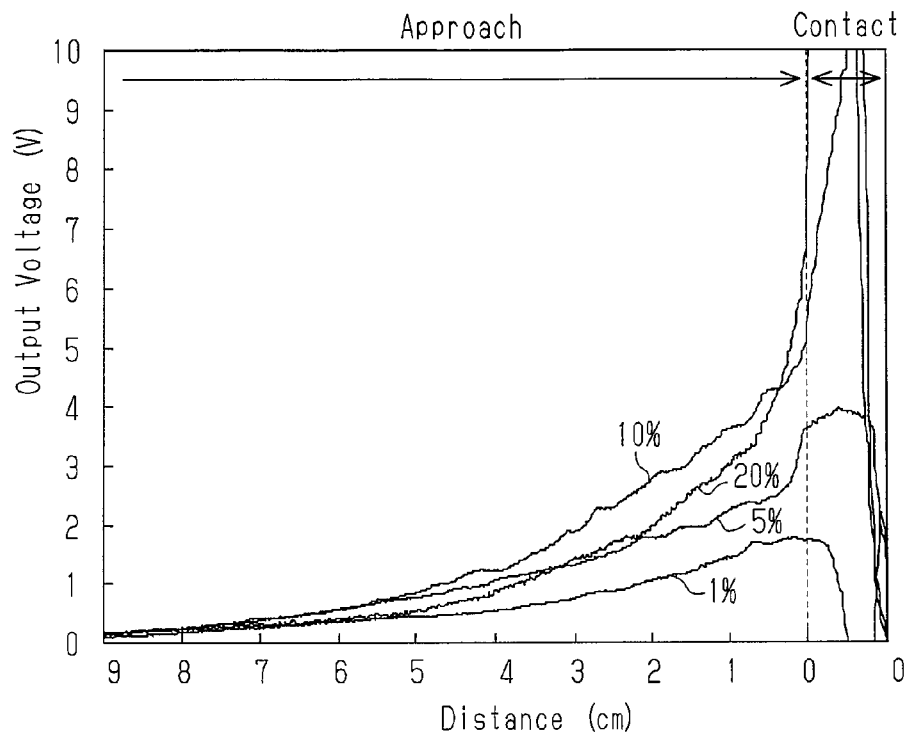
FIG. 5 is a graph showing the relationship between the distance from a hand to the sensor element and the output voltage of the proximity and contact sensor, depending on the quantity of coil-shaped carbon fibers.

Four planar sensor elements 11 were prepared. Each of them had a length of 95 mm, a width of 95 mm, and a thickness of 2 mm. Two electrodes 14 were attached to the bottom surface of each sensor element 11. The matrix 13 of each sensor element 11 was made of silicone resin (KE103, JIS A hardness being 18, manufactured by Shin-Etsu Chemical Co., Ltd) serving as elastic resin. The shape of the coil-shaped carbon fibers 12 was a double-helix type, with a wire diameter of 0.5 μm to 1 μm, a coil diameter of 5 μm to 10 μm, a coil pitch substantially the same as the wire diameter (gap between fibers being substantially zero), and a coil length of 150 μm to 300 μm. Each of the four sensor elements 11 had different contents of the coil-shaped carbon fibers 12, 1% by weight, 5% by weight, 10% by weight, and 20% by weight. In FIG. 5, the horizontal axis indicates the distance between the sensor element 11 and the object 24, and the vertical axis indicates the output voltage. FIG. 5 shows four curves for the different contents of the coil-shaped carbon fiber 12.

Copper electrode was used for the two electrodes 14. The detection circuit 16, consists of the high-frequency oscillation circuit 19, the wave detection circuit 22, and the others, was connected to the electrodes 14 with the first connection line 15, and a digital oscilloscope serving as the processor 18 was connected to the detection circuit 16 with the second connection lines 17. A high-frequency signal of 200 kHz was applied to the sensor element 11 by the high-frequency oscillation circuit 19. The proximity and contact sensor 10 was formed in this configuration.

As the object to be detected 24, a human palm was placed 8 cm above the sensor element 11. The changes in the output voltage were measured when the palm approached the sensor element 11. The results are shown in FIG. 5. As shown in FIG. 5, the output voltage (V) tends to increase as the content of the coil-shaped carbon fiber 12 in the sensor element 11 increases. However, when the content of the coil-shaped carbon fiber 12 is 10% by weight, the output voltage was the highest, that is, the sensitivity was the highest. Furthermore, when and after the palm touched the sensor element 11*a*, same or higher rate output voltage than approaching time was obtained. Thus, it is evident that the sensor 10 can detect not only the approach but also contact.

Example 2

Figure 6:
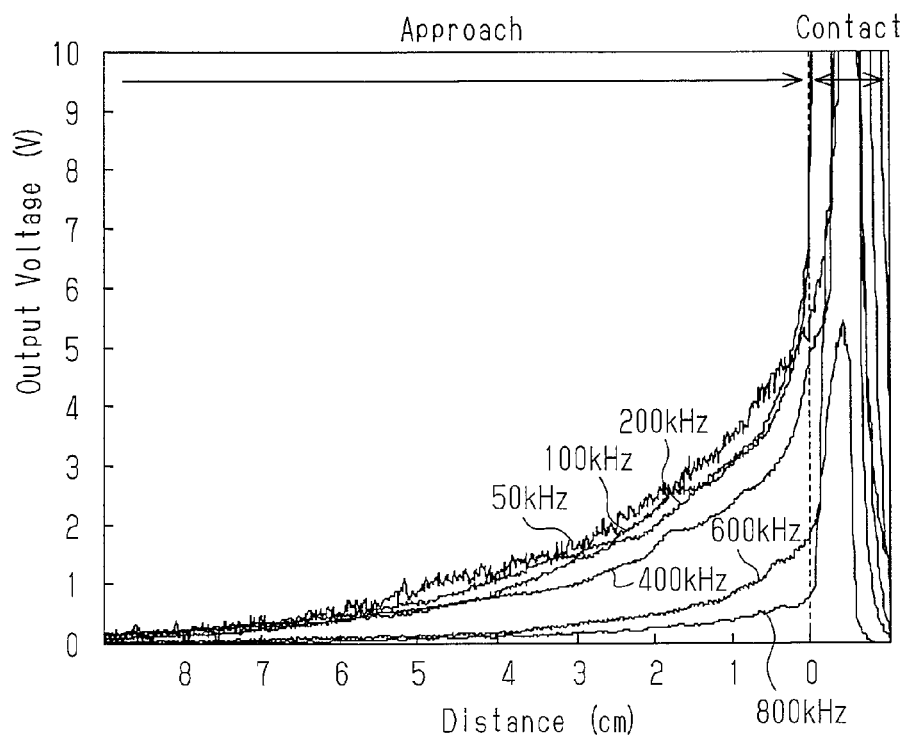
FIG. 6 is a graph showing the relationship between the distance from a hand to the sensor element and the output voltage of the proximity and contact sensor, depending on the frequency of a high-frequency signal.

In example 1, the content of the coil-shaped carbon fibers 12 was maintained at 20% by weight, and the different frequency of the high-frequency signal, 50 kHz, 100 kHz, 200 kHz, 400 kHz, 600 kHz, and 800 kHz, were applied by the high-frequency oscillation circuit 19 to the sensor element 11. Others parts were the same as example 1, and changes in output voltage when moving the palm toward the sensor element 11 were measured. The results are shown in FIG. 6. As apparent from the results shown in FIG. 6, when the frequency of the high-frequency signal was 800 kHz, changes in output voltage, when the palm approached the sensor element 11, were small and the detection sensitivity was low, but the approaching of the palm was still detected. As the frequency decreases, changes in output voltage increases and the detection sensitivity tends to increase. However, when the frequency of the high-frequency signal becomes 50 kHz, noise increases and disturbances occur in the output waveform. Therefore, the frequency of the high-frequency signal is preferably in the range of 100 to 800 kHz.

Example 3

Figure 7:
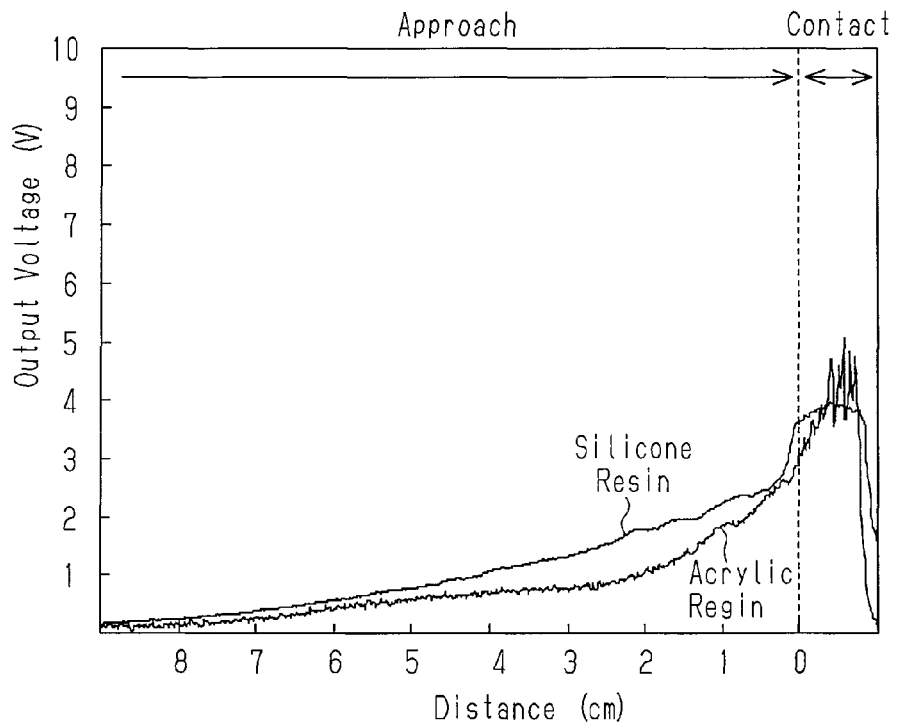
FIG. 7 is a graph showing the relationship between the distance from a hand to the sensor element and the output voltage of the proximity and contact sensor, depending on the substance of matrix.

In example 1, the content of the coil-shaped carbon fiber 12 was maintained at 5% by weight for the sensor element 11. The frequency of the high-frequency signal applied by the high-frequency oscillation circuit 19 to the sensor element 11 was maintained at 200 kHz. Acrylic resin was used as the matrix 13 of the sensor element 11. With other parts being the same as in example 1, changes in output voltage when moving the palm toward the sensor element 11 were measured. The results are shown in FIG. 7. As shown in FIG. 7, for acrylic resin, the output voltage was slightly low compared with silicone resin. However, the approaching of the object to be detected 24 was sufficiently detected.

It is apparent from FIG. 7 that the contact of the object to be detected 24 to the sensor element 11 can be detected either the matrix 13 is an elastically deformable material such as silicone resin having superior elasticity or a non-elastically deformable material such as acrylic resin.

Specifically, if the material of the matrix 13 is the elastically deformable material with superior elasticity such as silicone resin, the waveform of the output signal suddenly changes at the contact moment between the object to be detected 24 and the sensor element 11. Contact of the object to be detected 24 with the sensor element 11 can thus be detected from this sudden change in the waveform. Further, contact of the object to be detected 24 with the sensor element 11 can be detected based on the level of the output signal (if the substance of object to be detected 24 is known). When the matrix 13 is formed by an elastically deformable material, above sudden changes in the waveform of the output signal are presumed to be mainly caused by elastic deformation of the coil-shaped carbon fibers 12 due to mechanical external force applied by the object to be detected 24. Elastic deformation of the coil-shaped carbon fibers 12 changes the coil shape (length, diameter, winding density) and the distance between the coil-shaped carbon fibers 12. As a result, the LCR component of each coil-shaped carbon fiber 12 and the C component of the resonance circuit network change, and the impedance of the sensor element 11 changes. It is understood that this can be observed as changes in the waveform of the output signal. In the proximity and contact sensor using the matrix 13 made of an elastically deformable material, when the object to be detected 24 is contacting the sensor element 11, the contact pressure applied by the object to be detected 24 is relatively easily detected from the output signal.

If the matrix 13 is made of a non-elastically deformable material such as acrylic resin, disturbance (continuous sharp rise and sharp fall) in the level of the output signal occurs at the contact moment between the object to be detected 24 and the sensor element 11. Further, disturbance in the output signal level continues during the object to be detected 24 keeps contacting the sensor element 11. Contact of the object to be detected 24 with the sensor element 11 is detected when a disturbance appears in the output signal level. When the matrix 13 is made of a non-elastically deformable material, the cause of the disturbance in the output signal level is not understood, yet. It is assumed that internal stress of the matrix 13 generated by the mechanical external force applied by the object to be detected 24 influences the C component of the matrix 13 and the coil-shaped carbon fibers 12.

Example 4

Figure 8:
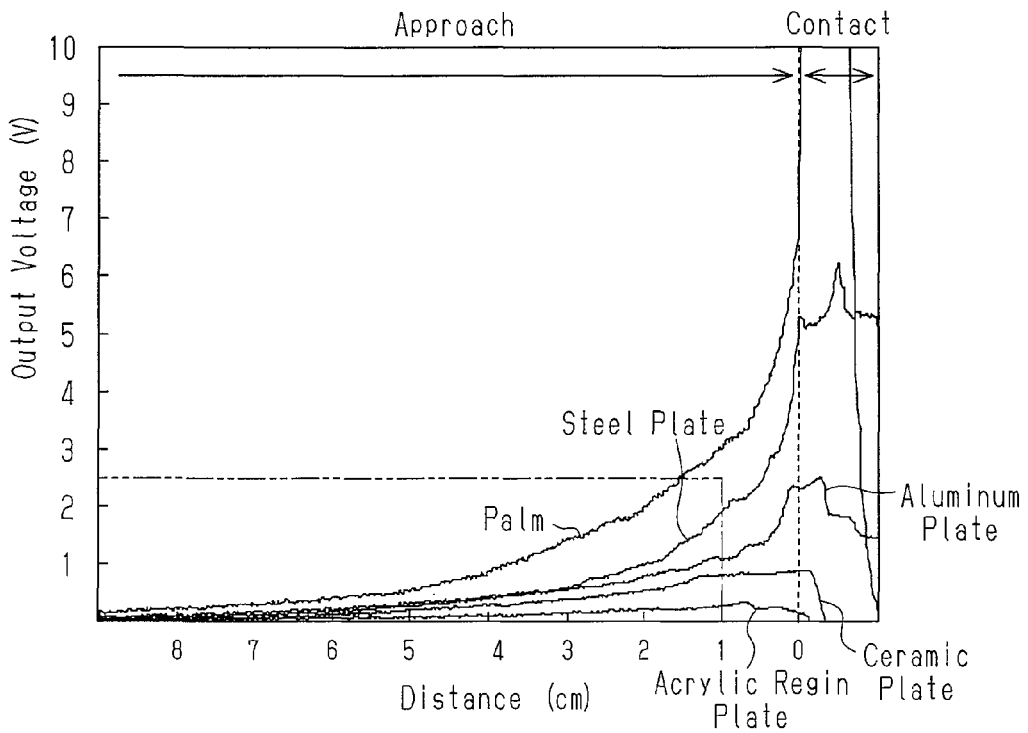
FIG. 8 is a graph showing the relationship between the distance from a hand to the sensor element and the output voltage of the proximity and contact sensor, depending on the material of object to be detected.

In example 1, the content of the coil-shaped carbon fibers 12 was maintained at 20% by weight for the sensor element 11. The frequency of the high-frequency signal applied by the high-frequency oscillation circuit 19 to the sensor element 11 was maintained at 200 kHz. Four types of substances of object to be detected 24, i.e., an acrylic resin plate, aluminum plate, steel plate, and ceramic plate were used. With other parts being the same as in example 1, changes in the output voltage when moving the object to be detected 24 toward the sensor element 11 were measured. The results are shown in FIG. 8. As shown in FIG. 8, changes in output voltage were the largest for the palm in example 1, followed in the order of the steel plate, the aluminum plate, the ceramic plate, and the acrylic resin plate. It is apparent from the results that the object to be detected 24 having an electrically charged surface or being made of a conductive material can be detected with higher sensitivity. The palm is assumed to have the highest sensitivity since its surface is electrically charged.

Example 5

Measurement of Approaching Speed

Figure 9:
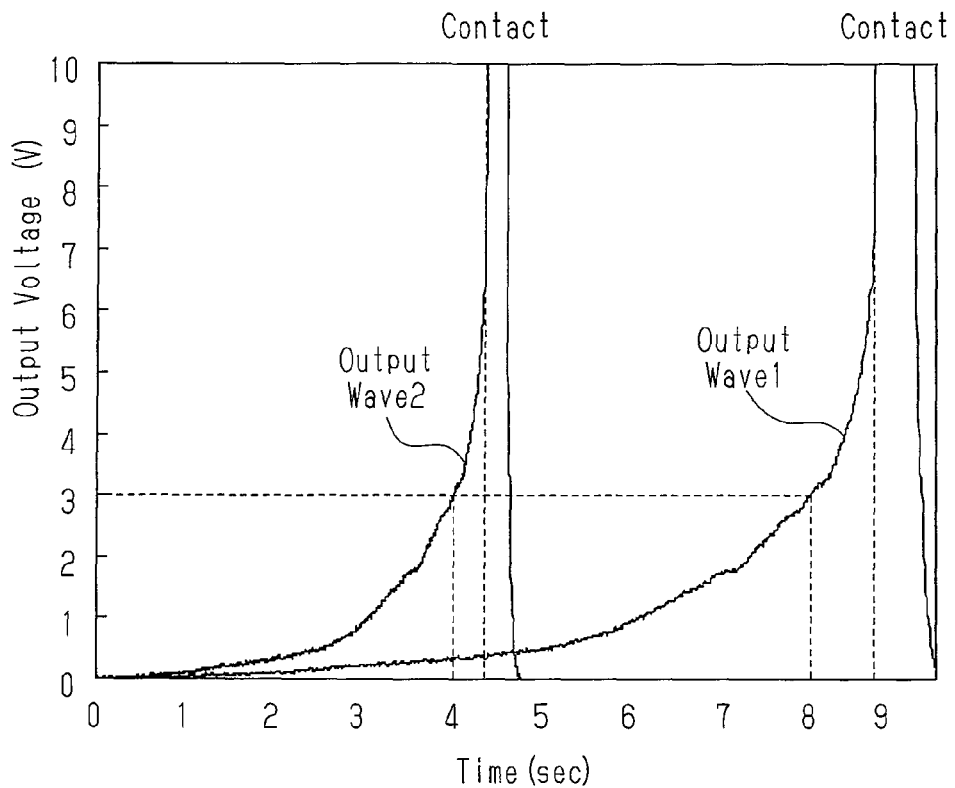
FIG. 9 is a graph showing the relationship between the distance from a hand to the sensor element and the output voltage of the proximity and contact sensor, depending on the approaching speed of the object to be detected.

When using a palm as the object to be detected 24 in example 4, the approaching speed is described with reference to FIG. 9.

The distance between the palm and the surface of the sensor element 11 was initially set to 9 cm (90 mm, output voltage 0 V). Move the palm 80 mm towards the sensor element 11 until it reaches 1 cm (10 mm, output voltage 3 V) above the sensor element 11. The output waveform 1 in FIG. 9 is a curve obtained when moving the palm toward the sensor element 11 at a speed of 10 mm/sec. The output voltage reached 3 V after 8 seconds. The output waveform 2 of FIG. 9 is a curve obtained when moving the palm toward the sensor element 11 at a different speed. Since the output voltage reached 3 V after 4 seconds from when starting the approaching movement, the approaching speed was 20 mm/sec (80/4=20).

Example 6

Distinction Between Living Body and Inanimate Object

In example 4, the substance of object to be detected 24 (e.g., living body (palm) and inanimate object (steel plate, aluminum plate, ceramic plate, and acrylic resin plate)) can be distinguished by using the output voltage as a reference, when the distance between the object to be detected 24 and the sensor element 11 is a predetermined value. In other words, when the distance between the object to be detected 24 and the sensor element 11 is 1 cm, it is determined that the object to be detected 24 is a living body if the output voltage is greater than or equal to 2.5V (position indicated by double-dashed line in FIG. 8) and that the object to be detected 24 is a inanimate object if the output voltage is less than 2.5 V. The output voltage used as a reference can be appropriately changed depending on the material of the object to be detected 24.

An object detection sensor 100 according to a second embodiment of the present invention is discussed focusing on differences from the first embodiment.

Figure 10:
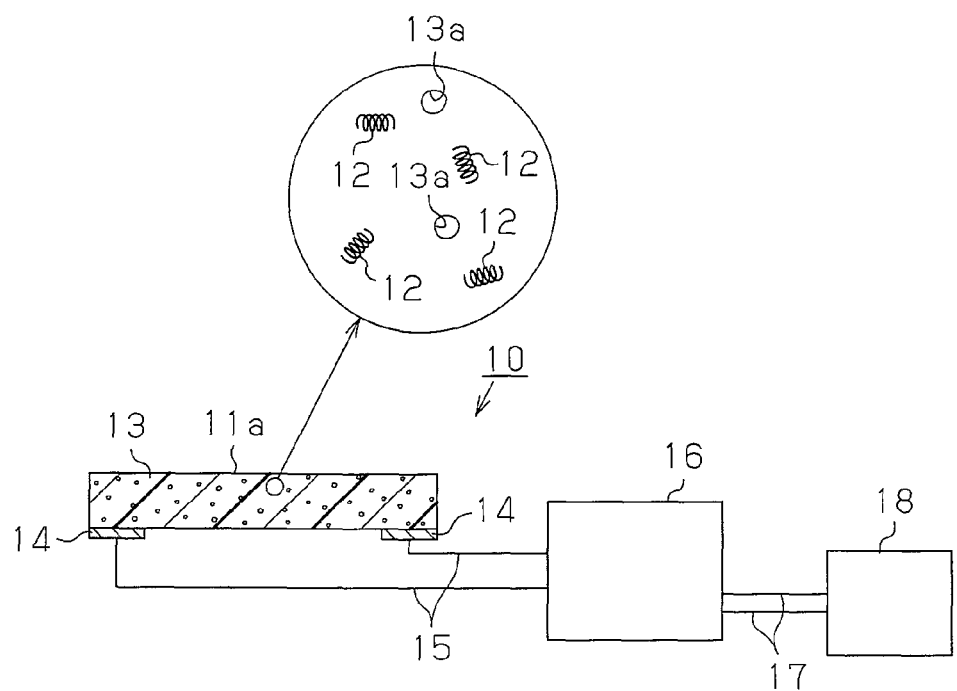
FIG. 10 is a diagram showing an proximity and contact sensor according to a second embodiment of the present invention.

As shown in FIG. 10, the object detection sensor 100 differs from that of the first embodiment in the structure of a sensor element 11a. The electrodes 14 and connecting portions of the electrodes 14 and the first connection lines 15 are preferably covered and insulated.

Elastomer can be used to form the matrix 13 of the second embodiment, in addition to the preferred materials described in the first embodiment.

In the second embodiment, a single-helix coil-shaped carbon fiber 12 is preferred with a wire diameter of 1 nm to 1 μm, a coil diameter of 1 nm to 100 μm, a spiral coil pitch of 1 nm to 100 μm, and a coil length of 100 μm to 10 mm. From the viewpoint of manufacturing easiness, it is further preferable that the coil diameter to be 1 nm to 10 μm, and the spiral pitch to be 10 nm to 10 μm. The coil length less than or equal to 150 μm is preferable to ensure dispersibility in the matrix 13.

In the second embodiment, a double-helix coil-shaped carbon fiber 12 is preferred with a wire diameter of 0.1 μm to 1 μm, a diameter of 0.01 μm to 50 μm, a spiral pitch of nearly zero, and a coil length of 0.1 mm to 10 mm.

In the second embodiment, the super-elastic coil is preferred with a coil diameter of 5 μm to 100 μm, a coil pitch of 0.1 μm to 10 μm, and a coil length of 0.3 mm to 5 mm.

In the second embodiment, in addition to carbon fibers having a spirally wound structure, carbon fibers that are simply twisted or tortuous may be used as the coil-shaped carbon fibers 12. The winding direction of the spirally wound coil-shaped carbon fibers 12 may be a clockwise direction (right handed) or counterclockwise direction (left handed) about the coil axis. The twisting direction of the simply twisted or tortuous coil-shaped carbon fibers 12 may be a clockwise direction (right handed) or counterclockwise direction (left handed) about the fiber axis.

A lot of pores 13a (see FIG. 11), which serve as a void portion, or one or more cavities 31 and 31a (see FIGS. 12 and 13), which serve as a void portion, are formed in the matrix 13. The pores 13a and the cavities 31 and 31a enhance the deformability of the matrix 13. The enhanced deformability of the matrix 13 increases the elastic deformability of the coil-shaped carbon fibers 12 in the matrix 13. At least one of the L component, C component, and R component of the coil-shaped carbon fibers 12 changes depending on the elastic deformation of the coil-shaped carbon fiber s12. Thus, the impedance of the sensor element 11a changes much more than the sensor element without pores or cavities with respect to changes in the pressure applied to the sensor element 11a. Therefore, the pores 13a or the cavities 31 and 31a in the matrix 13 greatly contribute to improve the detection sensitivity of the sensor element 11a.

Examples of methods for manufacturing the sensor element 11a are described.

(a) When forming the matrix 13 with thermoplastic resin, the coil-shaped carbon fibers 12 are added to the matrix, which is in a melted state, are agitated to uniformly disperse the coil-shaped carbon fibers 12, and are then compression molded in a mold.

(b) When forming the matrix 13 with thermosetting resin of a one-liquid curing type or two-liquid curing type, the coil-shaped carbon fibers 12 are added to the resin before the curing, are agitated to uniformly disperse the coil-shaped carbon fibers 12, and are then molded in a mold.

Examples of methods for manufacturing the matrix 13 including the pores 13a or cavities 31, 31a are described.

Figure 11:
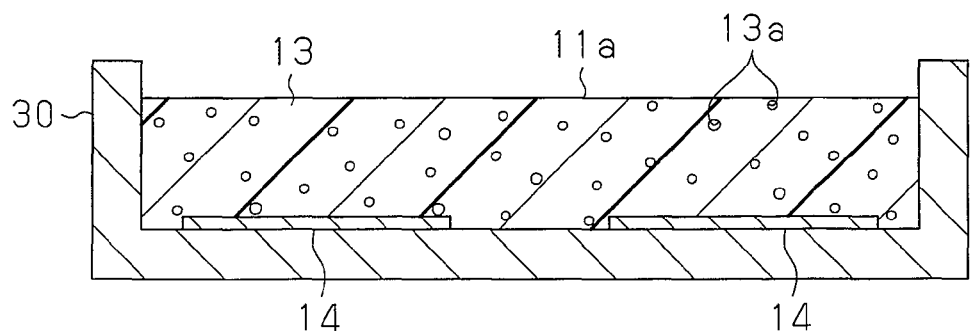
FIG. 11 is a schematic diagram of a manufacturing example of a sensor element of FIG. 10.
Figure 12:
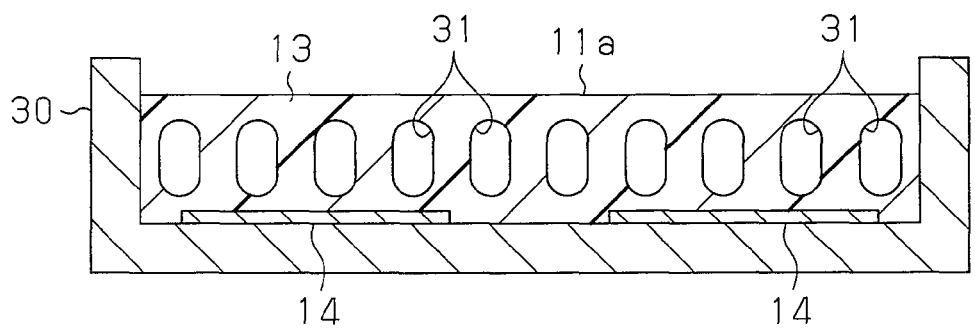
FIG. 12 is a schematic diagram of a manufacturing example of the sensor element shown in FIG. 10.

(a) As shown in FIG. 11, the two-liquid foamable resin is molded in a mold 30. This forms the matrix 13 with a lot of pores 13a.

(b) Resin is melted in the mold 30, and the melted resin is depressurized so as to form many pores 13a in the molded matrix 13.

(c) A plurality of rod-shaped cores (not shown) are set in the mold 30 to form, for example, a plurality of parallel channels (cavities) 31 that are open to one of the side surfaces of the matrix 13. The open end of the cavity 31 may be closed or left open. A plate shaped cover (not shown) formed by the same material as the matrix 13 is attached to the side surface of the molded matrix in which the cavities 31 to close the open end of the cavity 31. In this case, a plurality of closed cavities 31 is formed in the sensor element 11a.

Figure 13:
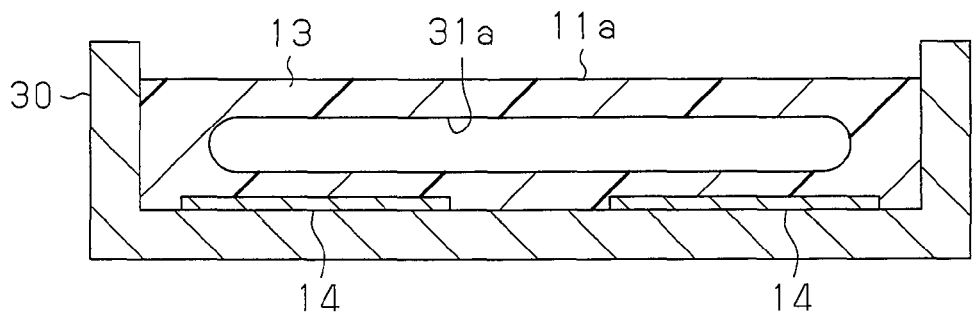
FIG. 13 is a schematic diagram of a manufacturing example of the sensor element shown in FIG. 10.

(d) Resin is melted in the mold 30. Air is injected into the melted resin from outside of the mold 30 by a syringe, a constant-rate air pump, or the like (not shown). In this case, a layer-shaped cavity 31a is formed in the matrix 13, and a matrix 13 with hollow is obtained, as shown in FIG. 13. The layer-shaped cavity 31a can be formed by one or more layer-shaped cores set in the mold 30 during the molding process.

Other parts such as the structure of the detection circuit 16, the equivalent circuit of the sensor element 11a, the quantity of the coil-shaped carbon fibers 12, and the like are as described in the first embodiment.

The operation of the sensor 100 of the second embodiment will is described.

Figure 14:
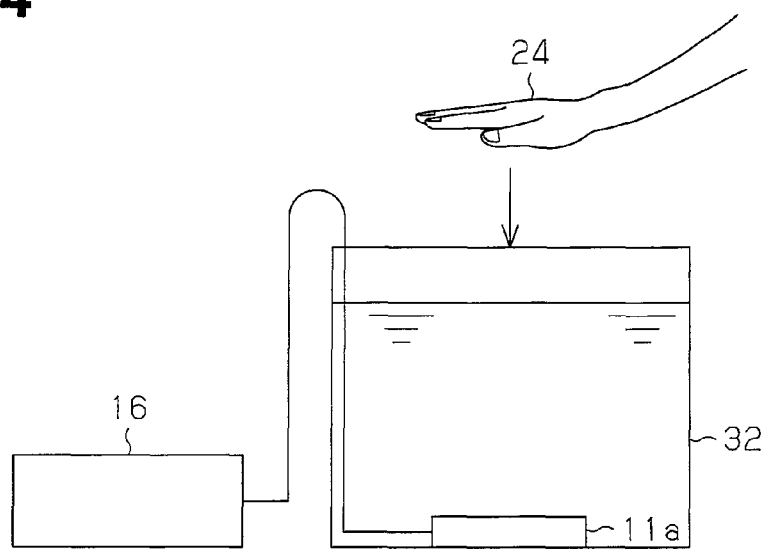
FIG. 14 is a schematic diagram of an application example of the sensor element shown in FIG. 10.

As shown in FIG. 14, the sensor element 11a is placed at the bottom of a tank 32 that contains water serving as a fluidic medium. When the high-frequency signal S1 is applied to the sensor element 11a from the detection circuit 16, the sensor element 11a generates an AC electro-magnetic field that reaches positions above the water surface. If the object to be detected 24 is within the AC electro-magnetic field, the sensor element 11a and the object to be detected 24 form a resonance circuit. In this case, the detection circuit 16 outputs the detection signal S3 with a voltage corresponding to the impedance of the resonance circuit.

Figure 15:
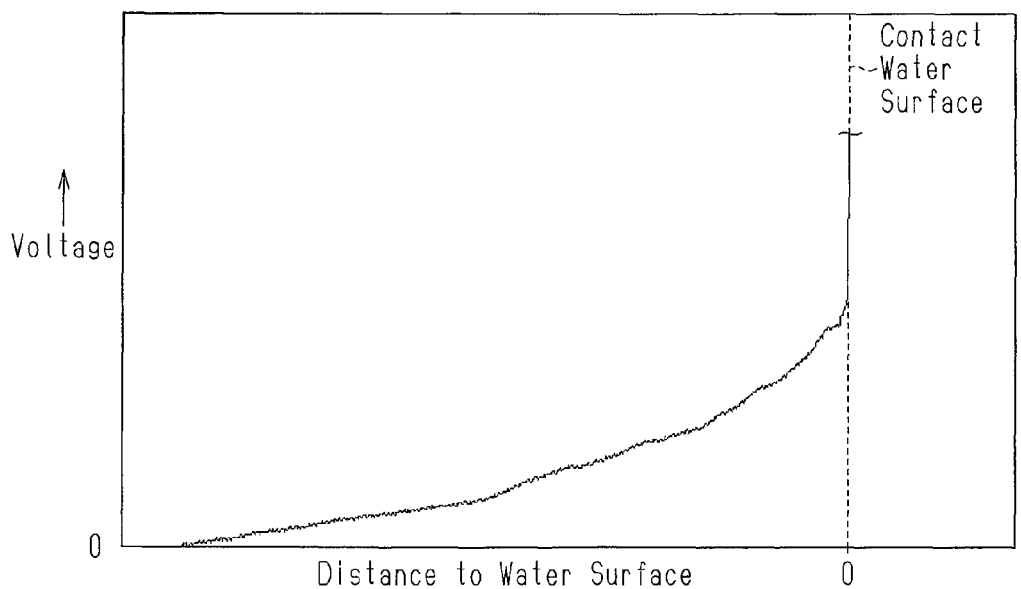
FIG. 15 is a graph showing the voltage of an output signal of the sensor shown in FIG. 10 that changes depending on the distance between an object and the water surface.

As the object to be detected 24 approaches the water surface of the tank 32, the impedance of the resonance circuit including the sensor element 11a and the object to be detected 24 continuously changes. As shown in FIG. 15, the voltage of the detection signal S3 of the detection circuit 16 continuously changes depending on the distance between the object to be detected 24 and the water surface. The changes in the detection signal S3 are inherent depending on the impedance of the object to be detected 24. Therefore, when the object to be detected 24 approaches the water surface, the relationship between changes in the detection signal S3 and the distance of the object from the surface of the water is measured in advance to build a database. By using this database, the approaching of the object to be detected 24 to the water surface can be detected based on the changes in the detection signal S3.

When the object to be detected 24 contacts the water surface, the impedance in the resonance circuit including the sensor element 11a and the object to be detected 24 suddenly changes. As shown in FIG. 15, the voltage of the detection signal S3 suddenly changes. Therefore, the contact of the object to be detected 24 with the water surface can be detected based on changes in the detection signal S3.

Figure 16:
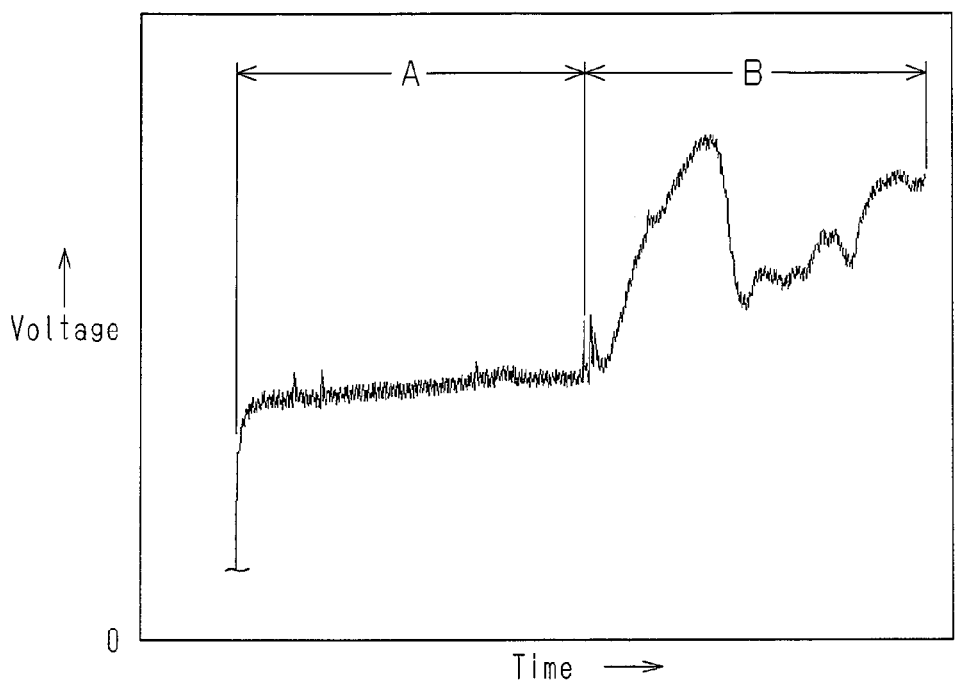
FIG. 16 is a graph showing the voltage of the output signal of the sensor shown in FIG. 10 that changes depending on the position of the object and the pressure from the object.
Figure 17:
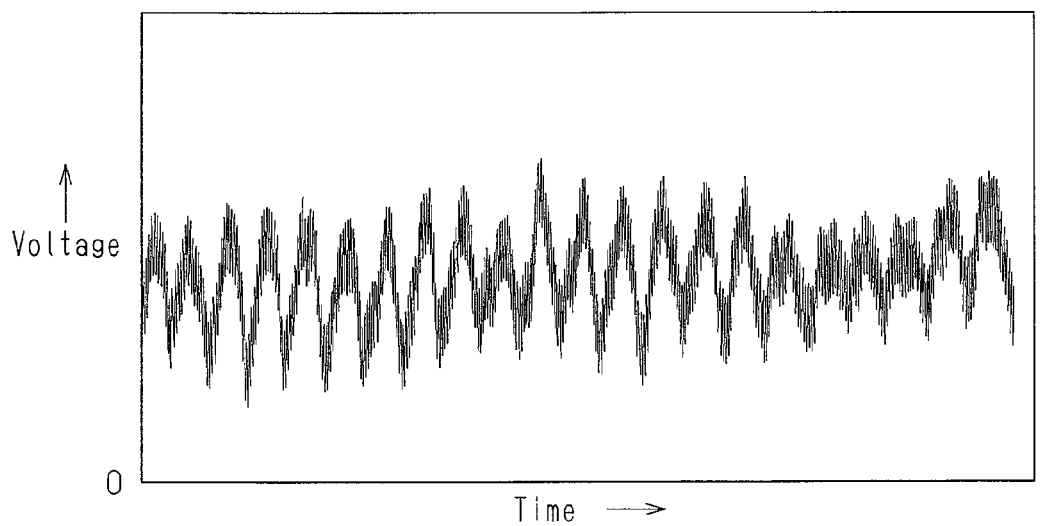
FIG. 17 is an enlarged view of range A shown in FIG. 16.
Figure 18:
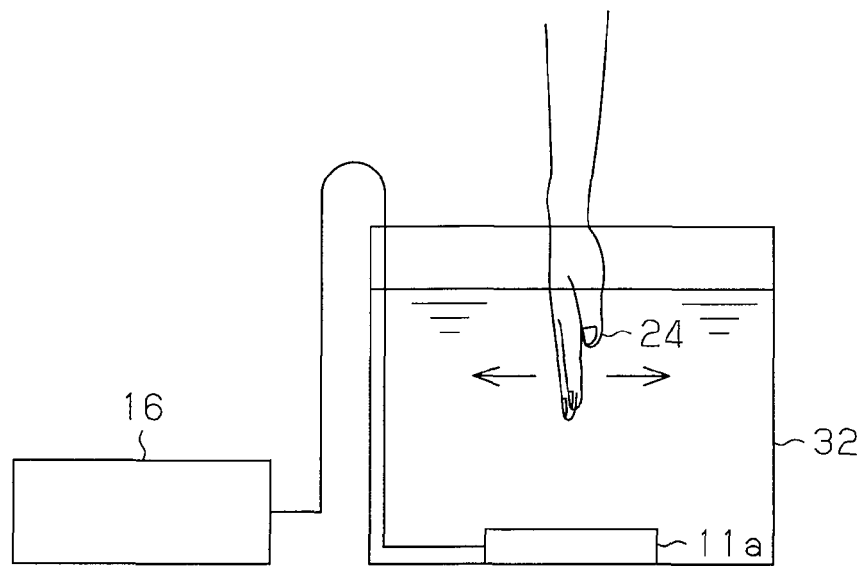
FIG. 18 is a schematic diagram of an application example of the sensor shown in FIG. 10.

In FIG. 16, range A shows changes in the detection signal S3 when the object to be detected 24 moves cyclically in the water of the tank 32 as shown in FIG. 18. FIG. 17 is an enlarged view of range A. When the object to be detected 24 moves cyclically in the water, the capacitance between the object to be detected 24 and the sensor element 11a cyclically changes as the distance between them changes. Furthermore, the movement of the object to be detected 24 cyclically changes the pressure applied to the sensor element 11a. The matrix 13 and the coil-shaped carbon fiber 12 are cyclically deformed by such cyclic changes in pressure. As a result, the impedance in the resonance circuit including the sensor element 11a and the object to be detected 24 cyclically changes, and the voltage of the detection signal S3 cyclically changes.

Due to the pores 13a and the cavities 31, 31a of the matrix 13, the coil-shaped carbon fibers 12 becomes easier to be deformed in addition to the matrix 13. This enhances the sensitivity and responsiveness of the sensor 100 with respect to pressure applied to the sensor element 11a in the water. Therefore, the behavior of the object to be detected 24 in the water can be detected satisfactorily based on changes in the detection signal S3.

Figure 19:
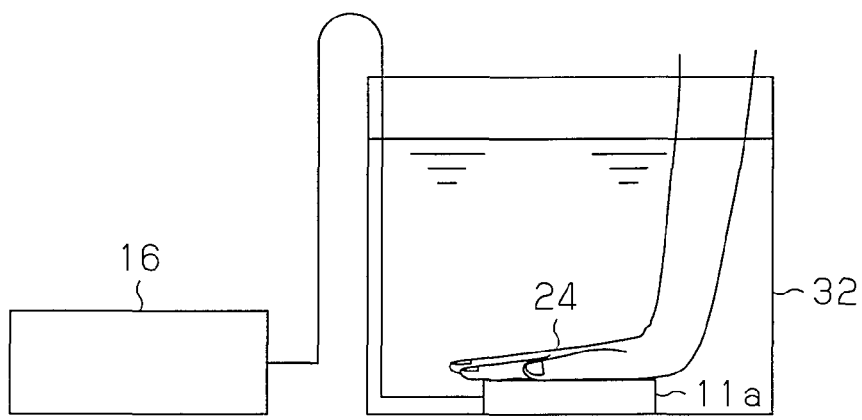
FIG. 19 is a schematic diagram of an application example of the sensor shown in FIG. 10.

As shown in FIG. 19, when the object to be detected 24 comes into contacted with the sensor element 11a in the water, the impedance in the resonance circuit including the sensor element 11a and the object to be detected 24 suddenly changes depending on level of the pressing force applied to the sensor element 11a by the object to be detected 24. As shown in FIG. 16, in range B, the voltage of the detection signal S3 greatly changes depending on the level of the pressing force applied by the object to be detected 24 to the sensor element 11a. Therefore, the contact of the object to be detected 24 with the sensor element 11a can be detected based on changes in the detection signal S3.

Figures 20, 21:
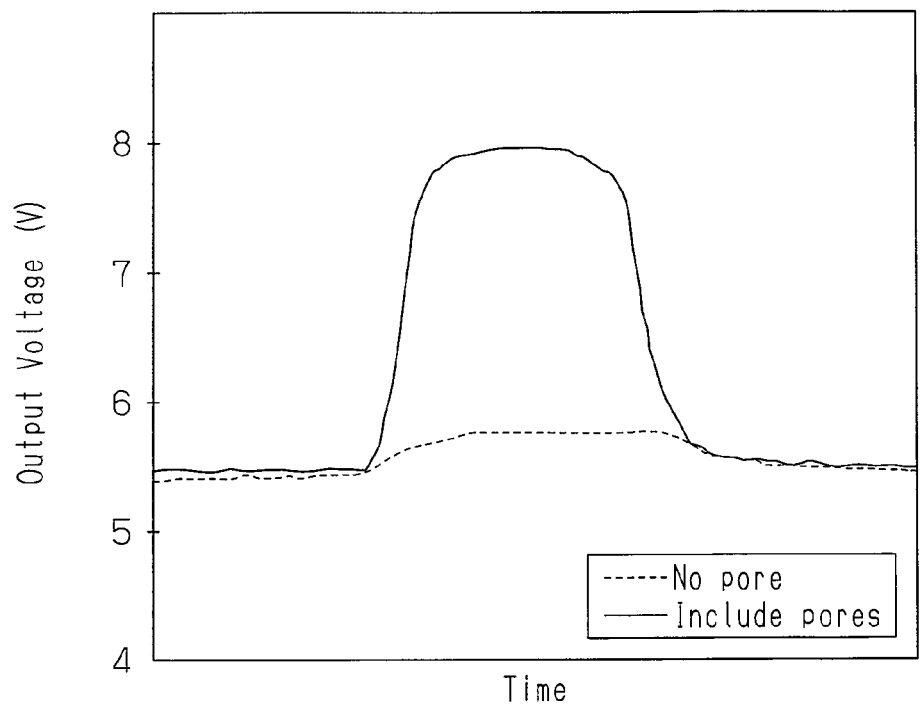
FIG. 20 is a graph showing the response characteristics of the sensor shown in FIG. 10.
FIG. 21 is a schematic diagram of an application example of the sensor shown in FIG. 10.

FIG. 20 shows a comparison of the response signals between the sensor elements with pores 13a and without pores inside the matrix 13, when pressure is applied to the sensor element 11a of the second embodiment in the water. It is apparent from FIG. 20 that the pores 13a formed in the matrix 13 drastically enhances sensitivity with respect to the pressure.

As described above, since the deformability of the sensor element 11a is increased by the pore 13a and the cavities 31 and 31a, the pressure applied to the sensor element 11a indirectly via a fluidic medium or the pressure applied by direct contact can be detected with high sensitivity.

An application example of the object detection sensor 100 is described.

In the example of FIG. 21, the sensor element 11a of the object detection sensor 100 is set at the bottom or on the sidewall of a bath 40. The object detection sensor 100 detects, the behavior of the care-required person 41, such as an elderly care or a nursing care, in a non-contact condition. The behavior includes the movement of going into and out of the bath 40, or the movements in the bath 40. The object detection sensor 100 detects whether the care-required person 41 is in the bath 40, by the direct contact of the person to the sensor element 11a. Accordingly, the bathing condition and behavior of the care-required person 41 can be remotely monitored.

Figure 22:
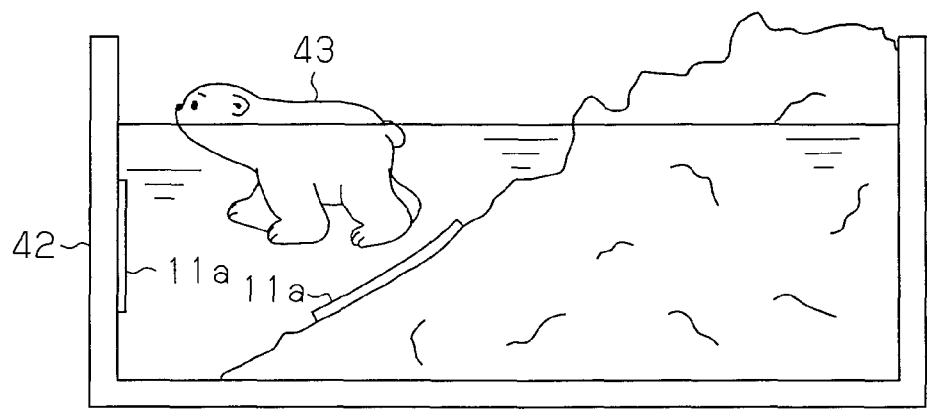
FIG. 22 is a schematic diagram of an application example of the sensor shown in FIG. 10.

In the example of FIG. 22, the sensor element 11a of the object detection sensor 100 is set in a water pool 42 at a zoo. The object detection sensor 100 detects, in a non-contact condition, the movement of an animal 43 getting into or out of the water pool 42 or the position of the animal 43 in the water pool 42. The object detection sensor 100 detects whether the animal 43 is in the water pool 42 with direct contact. Accordingly, the state of the animal 43 can be remotely monitored.

Figure 23:
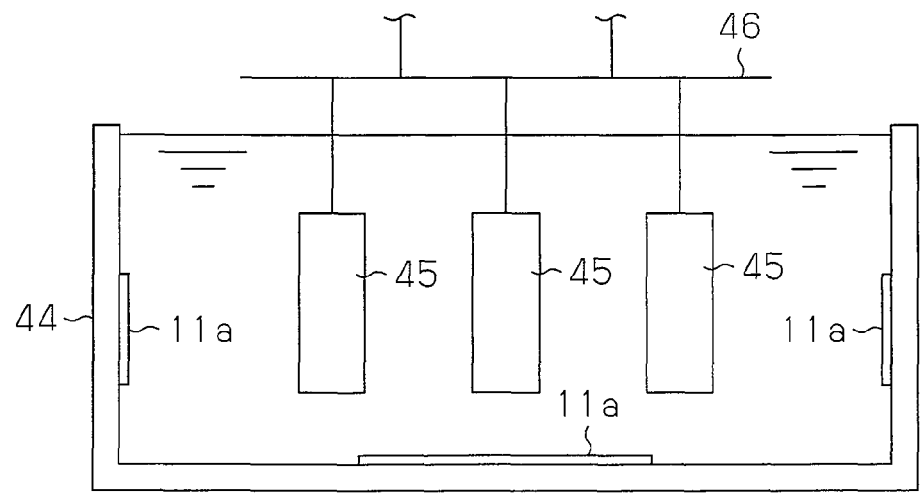
FIG. 23 is a schematic diagram of an application example of the sensor shown in FIG. 10.

In the example of FIG. 23, a plurality of sensor elements 11a of the object detection sensor 100 are set in a plating bath 44 of a plating process line. The object detection sensor 100 detects, in a non-contacting condition, the movement of work pieces 45 goes into and out of the plating bath 44 or the behavior of the work pieces 45 in the plating bath 44. When the work piece 45 falls off from a suspension jig 46 and sinks to the bottom, the object detection sensor 100 detects the contact of the work piece 45 at the bottom of the plating bath 44 by the sensor element 11a, located at the bottom of the plating bath 44. Accordingly, the plating processing of the work pieces 45 can be remotely monitored.

The second embodiment has the advantages described below.

(1) The coil-shaped carbon fibers 12 functioning as the LCR resonance circuit are dispersed in the matrix 13, which is a dielectric material, to form the sensor element 11a. The pores 13a or the cavities 31 and 31a are made in the matrix 13, that enable the sensor element 11a to be deformed easily. Thus, the sensor element 11a is easily, elastically deformed by pressure, and the amount of changes in impedance of the sensor element 11a with respect to changes in pressure becomes larger. Accordingly, when the sensor element 11a is positioned in a fluidic medium, the sensitivity relative to changes in the pressure transmitted to the sensor element 11a via the fluidic medium is enhanced. Further, the sensitivity to the pressure applied by the direct contact of the object to be detected 24 to the sensor element 11a is also enhanced. Therefore, if the sensor element 11a is positioned in the fluidic medium, the approach and contact of the object to be detected 24 to the surface of the fluidic medium, and the behavior of the object to be detected 24 in the fluidic medium are detected with high sensitivity. Furthermore, the contact of the object to be detected 24 with the sensor element 11a in the fluidic medium is detected.

(2) A lot of pores are made during the process of raw material of the matrix 13 is foamed, and the deformability of the sensor element 11a is enhanced by a lot of pores 13a. Therefore, machining for forming a cavity is not required after molding the sensor element 11a. This improves the productivity of the sensor element 11a.

(3) The cavities 31, 31a are formed using one or more cores in the mold when molding the sensor element 11a. Therefore, machining to make cavities 31, 31a is not required after molding the sensor element 11a. This improves the productivity of the sensor element 11a. Metal molds can make variety of shapes for cavities 31, 31a. This increases the deformability of the sensor element 11a in an effective and controlled manner.

The first and the second embodiments may be modified as described below.

A metal thin film of gold, copper, or the like may be formed on the surface of the coil-shaped carbon fiber 12 to enhance conductivity. In this case, the sensitivity and the stability of the sensor element 11 can be improved.

In the matrix 13, in addition to the coil-shaped carbon fibers 12, vapor grown fiber (VGCF), carbon nano-fiber, carbon powder, metal powder, dielectric powder, piezoelectric powder, and the like may be mixed.

Resins having different hardness or the like may be mixed to adjust the physical properties, such as hardness, of the matrix 13.

The single-helix coil-shaped carbon fibers 12 and the double-helix coil-shaped carbon fibers 12 may be mixed and used as the coil-shaped carbon fibers 12.

The positive and negative properties of the output voltage value may of course be inverted, or the output may be a current instead of the voltage. Such changes can easily be made by those skilled manufacturer.

The living body serving as the object to be detected 24 may be an animal such as a dog or a cat instead of a human.

In the second embodiment, the matrix 13 may include at least two of the pores 13a, the cavities 31, and the cavity 31a. When forming the matrix 13, the pores 13a may be foamed simultaneously with the formation of cavities 31 and/or 31a, by using one or more cores or the injection of air when molding the sensor element 11a. In this case, the sensor element 11 becomes easily deformable and the detection sensitivity is improved.

The sensor element 11a of the second embodiment may be used in an object detection sensor for detecting an animal in a zoo, aquarium, and the like approaching a water surface or its behavior in water.

The invention claimed is:

1. A proximity and contact sensor that detects the approach and contact of an object, the sensor comprising:
    a sensor element including a matrix and coil-shaped carbon fibers dispersed in the matrix, the coil-shaped carbon fibers having an inductance component, a capacitance component, and a resistance component that are depending on a coil shape of the coil-shaped carbon fibers, and the coil-shaped fibers functioning as an LCR resonance circuit;
    a pair of electrodes electrically connected to the sensor element;
    a high-frequency oscillation circuit connected between the pair of electrodes;
    a wave detection circuit for detecting a signal that is changed by the LCR resonance circuit; and
    an output circuit for outputting a voltage output signal that increases as the object approaches the sensor element.

2. The sensor according to claim 1, wherein the coil-shaped carbon fibers are contained in the matrix at an amount of 1 to 20% by weight.

3. The sensor according to claim 1, wherein the high-frequency oscillation circuit generates and outputs the high-frequency signal at a frequency of 100 to 800 kHz.

4. The sensor according to claim 1, wherein the matrix is a shaped product of a polymer having elasticity.

5. The sensor according to claim 1, wherein the sensor detects the approach of a living body.

6. The sensor according to claim 1, wherein the coil-shaped carbon fibers are single-helix coil-shaped carbon fibers or double-helix coil-shaped carbon fibers.

7. The sensor according to claim 1, wherein the wave detection circuit compares a reference high-frequency signal and an output signal of the sensor element to generate a detection signal that corresponds to the comparison result.

8. The sensor according to claim 7, further comprising:
    a phase adjustment circuit connected between the high-frequency oscillation circuit and the wave detection circuit, with the phase adjustment circuit adjusting a phase of the high-frequency signal to generate a phase-adjusted high-frequency signal and providing the wave detection circuit with the phase-adjusted high-frequency signal as the reference high-frequency signal.

9. The sensor according to claim 1, wherein the matrix of the sensor element includes a void portion so that the sensor element easily deforms.

10. The sensor according to claim 9, wherein the void portion is formed by foaming a material of the matrix.

11. The sensor according to claim 9, wherein the void portion is formed by one or more cores used as part of a mold for molding the sensor element.

12. The sensor according to claim 9, wherein the matrix is porous, and the void portion includes a pore of the porous matrix.

13. The sensor according to claim 9, wherein the void portion includes a plurality of parallel channels formed in the matrix.

14. The sensor according to claim 9, wherein the matrix is a hollow body having a layer-shaped cavity.

15. A proximity and contact sensor that detects the approach and contact of an object, the sensor comprising:
   a sensor element including an elastically deformable matrix and a plurality of elastically deformable coil-shaped carbon fibers dispersed in the matrix, the sensor element having an impedance that changes depending on the elastic deformation of the matrix and the coil-shaped carbon fibers; and
   a detection circuit connected to the sensor element, the wave detection circuit including:
      first and second electrodes electrically connected to the sensor element;
      a high-frequency oscillation circuit for providing a high-frequency signal to the sensor element via the first electrode; and
      a wave detection circuit for receiving an output signal of the sensor element via the second electrode and generating a detection signal that depends on a change in the impedance of the sensor element that occurs when the object approaches.

16. The sensor according to claim 15, further comprising:
   a processor, connected to the wave detection circuit, for processing the output signal of the wave detection circuit, wherein the processor includes a database recording inherent changes in the output signal of the wave detection circuit for various objects, and the processor refers to the output signal of the wave detection circuit and the database to determine the substance of the object.

17. A proximity and contact sensor that detects the approach and contact of an object, the sensor comprising:
   a sensor element including a matrix and coil-shaped carbon fibers dispersed in the matrix, the coil-shaped carbon fibers having an inductance component, a capacitance component, and a resistance component that are depending on a coil shape of the coil-shaped carbon fibers, and the coil-shaped fibers functioning as an LCR resonance circuit;
   a pair of electrodes electrically connected to the sensor element;
   a high-frequency oscillation circuit connected between the pair of electrodes; and
   a wave detection circuit for detecting a signal that is changed by the LCR resonance circuit further comprising:
   an output circuit for outputting an output signal that differs when the object contacts the sensor element and when the object approaches the sensor element.

18. A method for detecting an object using the sensor according to claim 9, the method comprising the steps of:
   setting the sensor element in a fluidic medium; and
   measuring a change in an output signal of the sensor element, and detecting the approaching of the object to a surface of the fluidic medium, contact of the object with the surface of the fluidic medium, behavior of the object in the fluidic medium, and contact of the object with the sensor element.

* * * * *